(12) United States Patent
Yue et al.

(10) Patent No.: US 10,656,446 B2
(45) Date of Patent: May 19, 2020

(54) METHOD FOR MANUFACTURING FLAT LIQUID CRYSTAL DISPLAY DEVICE FILM

(71) Applicant: Shenzhen China Star Optoelectronics Technology Co., Ltd., Shenzhen, Guangdong (CN)

(72) Inventors: Shouzhen Yue, Guangdong (CN); Mengmeng Zhang, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 125 days.

(21) Appl. No.: 15/329,372

(22) PCT Filed: Jan. 16, 2017

(86) PCT No.: PCT/CN2017/071236
§ 371 (c)(1),
(2) Date: Dec. 7, 2017

(87) PCT Pub. No.: WO2018/120317
PCT Pub. Date: Jul. 5, 2018

(65) Prior Publication Data
US 2018/0341131 A1    Nov. 29, 2018

(30) Foreign Application Priority Data

Dec. 29, 2016 (CN) .......................... 2016 1 1244077

(51) Int. Cl.
G03F 7/20       (2006.01)
G02F 1/1333   (2006.01)
(Continued)

(52) U.S. Cl.
CPC ............ *G02F 1/1333* (2013.01); *G03F 7/168* (2013.01); *G03F 7/2022* (2013.01); *G03F 7/30* (2013.01); *H01L 27/1288* (2013.01)

(58) Field of Classification Search
CPC ......... G02F 1/133512; G02F 1/133514; G02F 1/133516; G02F 1/13439;
(Continued)

(56) References Cited

U.S. PATENT DOCUMENTS

2009/0226629 A1 *  9/2009  Yen .......................... C08J 7/04
                                                          427/510
2013/0093971 A1   4/2013  Matsushima

FOREIGN PATENT DOCUMENTS

CN    102394238 A    3/2012
CN    103700674 A    4/2014
(Continued)

OTHER PUBLICATIONS

Computer-generated translation of JP 2000-298208 (Year: 2000).*
(Continued)

*Primary Examiner* — John A McPherson

(57) ABSTRACT

Disclosed is a method for manufacturing a flat liquid crystal display device film. According to the method for manufacturing the flat liquid crystal display device film, influence of a wiring thickness on topography of array film can be reduced. Without affecting a qualified rate of a product, a low-resistance wiring can be realized, and thus an RC delay during signal transmission of a large-sized panel can be reduced. Meanwhile, when the method is applied, a metal layer with a larger thickness relative to that of a metal layer made by a conventional method can be made. Therefore, wiring load of a large-sized panel can be reduced, resistance of signal line can be reduced. RC delay can be decreased, and display quality can be improved.

8 Claims, 3 Drawing Sheets

(51) Int. Cl.
*G03F 7/30* (2006.01)
*G03F 7/16* (2006.01)
*H01L 27/12* (2006.01)

(58) Field of Classification Search
CPC ........ G02F 2001/133357; G02F 2001/136295;
G03F 7/0007; G03F 7/0035; G03F 7/20;
G03F 7/2022
USPC ..... 430/7, 314, 315, 318, 319, 321; 349/110
See application file for complete search history.

(56) References Cited

FOREIGN PATENT DOCUMENTS

| | | | |
|---|---|---|---|
| CN | 103779202 A | | 5/2014 |
| CN | 104460093 A | | 3/2015 |
| CN | 104698709 A | | 6/2015 |
| JP | 2000-298208 A | * | 10/2000 |

OTHER PUBLICATIONS

International Search Report dated Jan. 16, 2017 for International Patent Application No. PCT/CN2017/071236.
Chinese Office Action dated Feb. 12, 2018 for Chinese Patent Application No. 201611244077.9.

* cited by examiner

METHOD FOR MANUFACTURING FLAT LIQUID CRYSTAL DISPLAY DEVICE FILM

CROSS-REFERENCE TO RELATED APPLICATIONS

This application claims the priority of Chinese patent application CN201611244077.9, entitled "Method for manufacturing flat liquid crystal display device film" and filed on Dec. 29, 2016, the entirety of which is incorporated herein by reference.

FIELD OF THE INVENTION

The present disclosure relates to the technical field of liquid crystal display, and in particular, to a method for manufacturing a flat liquid crystal display device film.

BACKGROUND OF THE INVENTION

At present, large-sized and high-resolution display panel has become a development trend of liquid crystal display device (LCD). However, with increasing of LCD panel size, RC delay of gate wiring and data wiring also increases (as shown in FIG. 1). Excessive RC delay may cause insufficient charging or wrong charging of pixel area, which seriously affects display quality of LCD panel, such as poor display of LCD panel and abnormal image.

In order to solve the aforesaid problem, it is proposed in the prior art that a thickness of a metal layer can be increased. Under the condition that a capacitance is not increased, a resistance is decreased and a signal line load is reduced. However, if the metal layer is too thick, topography of array film will be affected. As a result, a film coated on the metal layer has difficulty in climbing and may break (as shown in FIG. 2), which leads to problems such as corrosion of wiring and short connection. A qualified rate of a product will be seriously reduced. At the same time, there is no planarization technology in traditional array manufacturing procedure, which limits continuous decrease of a signal line resistance.

SUMMARY OF THE INVENTION

Aiming at the disadvantages in the prior art, the present disclosure provides a method for improving a flatness of a liquid crystal display device film, so that influence of a wiring thickness on topography of array film can be reduced. Without affecting a qualified rate of a product, a low-resistance wiring can be realized, and thus an RC delay during signal transmission of a large-sized panel can be reduced.

According to a first aspect, the present disclosure provides a flat liquid crystal display device film, and a structure thereof comprises:

a substrate;

a negative photoresist layer after developing procedure, which is located on an upper surface of the substrate; and a flat liquid crystal display device film, which is embedded in a space having a shape defined by a liquid crystal display device film of the negative photoresist layer after developing procedure and is flush with the negative photoresist layer after developing procedure.

According to some embodiments of the present disclosure, the structure of the flat liquid crystal display device film further comprises:

a negative photoresist protection layer, which is located below the flat liquid crystal display device film, and meantime covers a surface of the negative photoresist layer after developing procedure and a surface of the space having the shape defined by the liquid crystal display device film.

According to a second aspect, the present disclosure provides a method for manufacturing a flat liquid crystal display device film, which comprises steps of:

step A, coating a negative photoresist layer on a substrate, and exposing the negative photoresist layer with a liquid crystal display device film mask to obtain a negative photoresist layer after exposing procedure which covers the substrate;

step B, developing the negative photoresist layer after exposing procedure, and forming a space having a shape defined by a liquid crystal display device film in the negative photoresist layer after developing procedure which covers an upper surface of the substrate;

step D, sputtering and growing a liquid crystal display device film on a surface of the negative photoresist layer after developing procedure and a surface of the space having the shape defined by the liquid crystal display device film, so that the liquid crystal display device film covers the surface of the negative photoresist layer after developing procedure, and meanwhile covers the surface of the space having the shape defined by the liquid crystal display device film;

step E, coating a positive photoresist layer on a surface of the liquid crystal display device film, so that the positive photoresist layer covers the surface of the liquid crystal display device film, and fills the space having the shape defined by the liquid crystal display device film;

step F, exposing the positive photoresist layer with a liquid crystal display device film mask, and developing the positive photoresist layer to obtain a positive photeresist layer after developing procedure which is embedded in the space having the shape defined by the liquid crystal display device film of the liquid crystal display device film; and step G, etching excess liquid crystal display device film with a photoresist pattern mask to obtain the flat liquid crystal display device film.

According to some embodiments of the present disclosure, the method further comprises step C, coating a negative photoresist protection layer on the surface of the negative photoresist layer after developing procedure and the surface of the space having the shape defined by the liquid crystal display film.

According to the present disclosure, in step G, the flat liquid crystal display device film is embedded in the space having the shape defined by the liquid crystal display device film of the negative photoresist layer after developing procedure and is flush with the negative photoresist layer after developing procedure.

According to the present disclosure, in step A, a thickness of the negative photoresist layer coated therein is from 1.0 to 1.5 times a thickness of the liquid crystal display device film.

According to the present disclosure, in step D, the liquid crystal display device film is sputtered and grown on a surface of the negative photoresist layer after developing procedure and a surface of the space having the shape defined by the liquid crystal display device film which are both covered with a negative photoresist protection layer, so that the liquid crystal display device film covers the surface of the negative photoresist layer after developing procedure and the surface of space having the shape defined by the liquid crystal display device film which are both covered with the negative photoresist protection layer.

According to the present disclosure, a thickness of the negative photoresist protection layer is in a range from 0.1 to 0.2 µm.

According to some embodiments of the present disclosure, the negative photoresist protection layer is made of silicon nitride or silicon oxide.

According to the present disclosure, the flat liquid crystal display device film is made of one selected from a group consisting of metal M1, metal M2 and black matrix (BM).

According to the present disclosure, the substrate is a glass substrate or a plastic substrate.

Compared with the prior art, one embodiment or more embodiments can have the following advantages or beneficial effects.

According to the method for manufacturing the flat liquid crystal display device film, influence of a wiring thickness on topography of array film can be reduced. Without affecting a qualified rate of a product, a low-resistance wiring can be realized, and thus an RC delay during signal transmission of a large-sized panel can be reduced. Meanwhile, when the method is applied, a metal layer with a larger thickness relative to that of a metal layer made by a conventional method can be made. Therefore, wiring load of a large-sized panel can be reduced; resistance of signal line can be reduced; RC delay can be decreased; and display quality can be improved.

Other features and advantages of the present disclosure will be further explained in the following description, and partially become self-evident therefrom, or be understood through the embodiments of the present disclosure. The objectives and advantages of the present disclosure will be achieved through the structure specifically pointed out in the description, claims, and the accompanying drawings.

BRIEF DESCRIPTION OF THE DRAWINGS

The accompanying drawings provide further understandings of the present disclosure or the prior art, and constitute one part of the description. The drawings are used for interpreting the present disclosure together with the embodiments, not for limiting the present disclosure. In the drawings:

FIGS. 3 to 6 show main process steps of a method for manufacturing a flat liquid crystal display device film according to one embodiment of the present disclosure, and during the process, a negative photoresist protection layer is not formed on a surface of a negative photoresist layer, in which:

FIG. 3 schematically shows a step of exposing the negative photoresist layer which covers a substrate;

FIG. 4 schematically shows a structure of the negative photoresist layer with a space having a shape defined by a liquid crystal display device film;

FIG. 5 schematically shows a structure of embedding a positive photoresist layer after developing procedure in the space having the shape defined by the liquid crystal display device film of the liquid crystal display device film;

FIG. 6 schematically shows a structure of obtained flat liquid crystal display device film;

FIGS. 3, 4, 7, and 8 show main process steps of a method for manufacturing a flat liquid crystal display device film according to the other embodiment of the present disclosure, and during the process, a negative photoresist protection layer is formed on a surface of a negative photoresist layer, in which:

FIG. 7 schematically shows a structure of embedding a positive photoresist layer after developing procedure in the space having the shape defined by the liquid crystal display device film of the liquid crystal film display device; and FIG. 8 schematically shows a structure of obtained flat liquid crystal display device film.

DETAILED DESCRIPTION OF THE EMBODIMENTS

The present disclosure will be explained in details with reference to the embodiments and the accompanying drawings, whereby it can be fully understood how to solve the technical problem by the technical means according to the present disclosure and achieve the technical effects thereof, and thus the technical solution according to the present disclosure can be implemented. It should be noted that, as long as there is no conflict, all the technical features mentioned in all the embodiments may be combined together in any manner, and the technical solutions obtained in this manner all fall within the scope of the present disclosure.

As previously described, a method of decreasing an RC delay by increasing a thickness of a metal layer will easily cause the problems such as corrosion of wiring and short connection, and a qualified rate of a product will be seriously reduced. At the same time, there is no planarization technology in a traditional array manufacturing procedure, which prevents continuous thickening of the metal layer, and limits continuous decrease of a signal line resistance. According to the present disclosure, a negative photoresist is used to increase a flatness of an array, and to reduce influence of a wiring thickness on array topography, thereby realizing low resistance wiring. The present disclosure is based on the aforesaid method.

Embodiment 1

FIGS. 3 to 6 show main process steps of a method for manufacturing a flat liquid crystal display device film according to the present embodiment. The flat liquid crystal display device film is made of one selected from a group consisting of metal M1 metal M2 and black matrix (BM). The method mainly comprises following steps.

Figure 1:
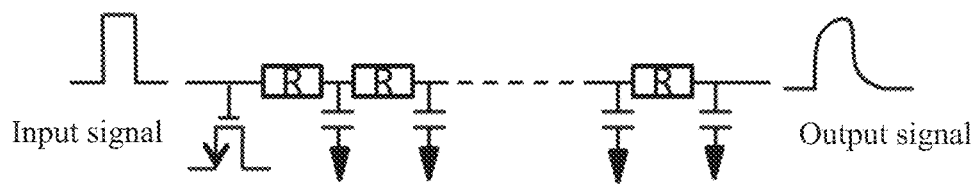
FIG. 1 schematically shows RC delay of a gate wiring and a data wiring.
Figure 2:
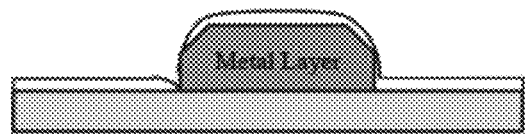
FIG. 2 schematically shows breakage of a film covering a metal layer with an excess thickness.
Figure 3:
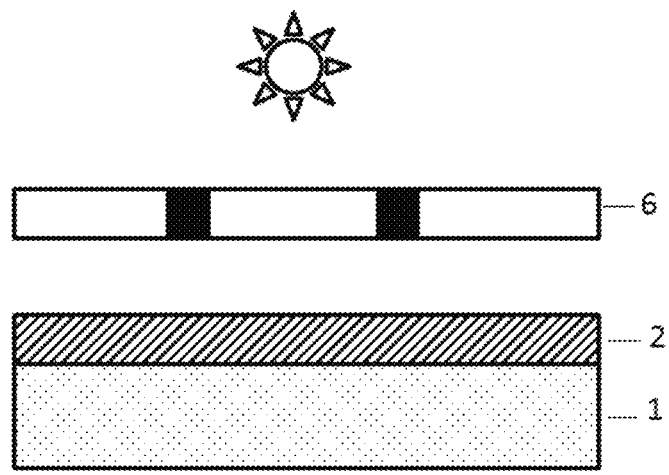

In step A, as shown in FIG. 3, a negative photoresist layer 2 is coated on a substrate 1, and the negative photoresist layer 2 is exposed with a liquid crystal display device film mask 6 to obtain a negative photoresist layer 2 after exposing procedure which covers the substrate 1.

In step B, the negative photoresist layer 2 after exposing procedure is developed, and a space 5 having a shape defined by a liquid crystal display device film is formed in a negative photoresist layer 2' after developing procedure which covers an upper surface of the substrate. A structure thereof is shown in FIG. 4.

Figure 4:
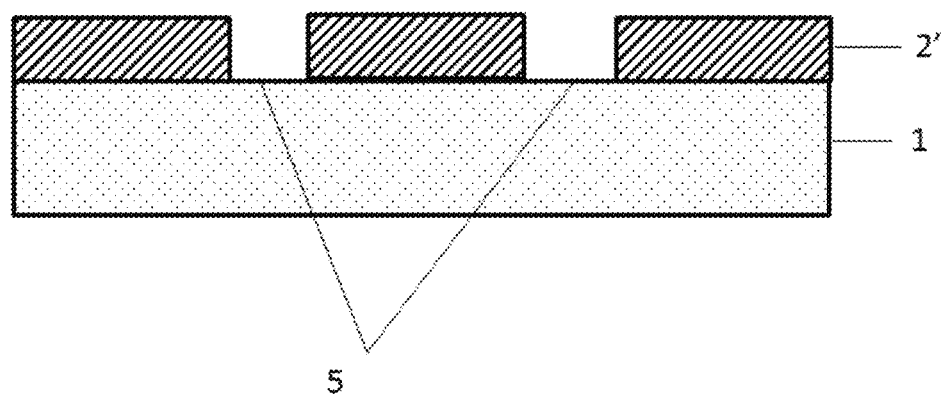

As can be seen from FIG. 4, the structure comprises:

the substrate 1, which is a glass substrate or a plastic substrate; and the negative photoresist layer 2' after developing procedure, which is located on the upper surface of the substrate 1.

In step D, a liquid crystal display device film 3 is sputtered and grown on a surface of the negative photoresist layer 2' after developing procedure and a surface of the space 5 having the shape defined by the liquid crystal display device film, so that the liquid crystal display device film 3 covers the surface of the negative photoresist layer 2' after developing procedure, and meanwhile covers the surface of the space 5 having the shape defined by the liquid crystal display device film.

In step E, a positive photoresist layer (a structure thereof is not shown in FIG. 5) is coated on a surface of the liquid crystal display device film 3, so that the positive photoresist layer covers a surface of the liquid crystal display device film 3, and fills the space 5 having the shape defined by the liquid crystal display film.

Figure 5:
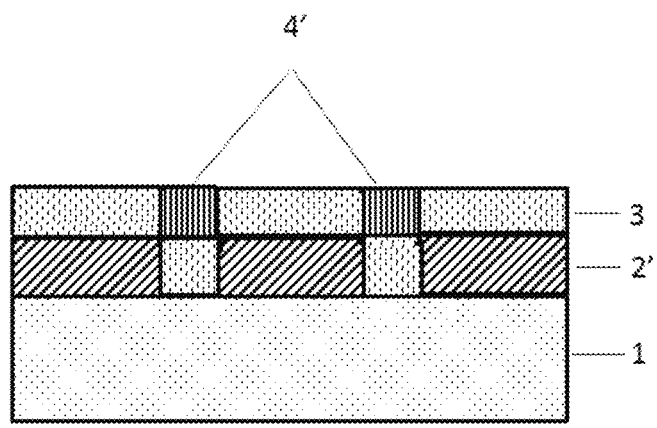

In step F, the positive photoresist layer is exposed with a liquid crystal display device film mask 6 and developed to obtain a positive photoresist layer 4' after developing procedure which is embedded in the space having the shape defined by the liquid crystal display device film of the liquid crystal display device film, and a structure thereof is shown in FIG. 5.

As can be seen from FIG. 5, the structure comprises:

the substrate 1, which is a glass substrate or a plastic substrate;

the negative photoresist layer 2' after developing procedure, which is located on the upper surface of the substrate 1;

the liquid crystal display device film 3, which covers the surface of the negative photoresist layer 2' after developing procedure, and meanwhile covers the surface of the space 5 having the shape defined by the liquid crystal display device film; and the positive photoresist layer 4' after developing procedure, which is embedded in the space 5 having the shape defined by the liquid crystal display device film of the liquid crystal display device film.

In step G, excess liquid crystal display device film is etched with a photoresist pattern mask to obtain a flat liquid crystal display device film 3'. The flat liquid crystal display device film 3' is embedded in the space 5 having the shape defined by the liquid crystal display device film of the negative photoresist layer 2' after developing procedure and is flush with the negative photoresist layer 2' after developing procedure. A structure thereof is shown in FIG. 6.

Figure 6:
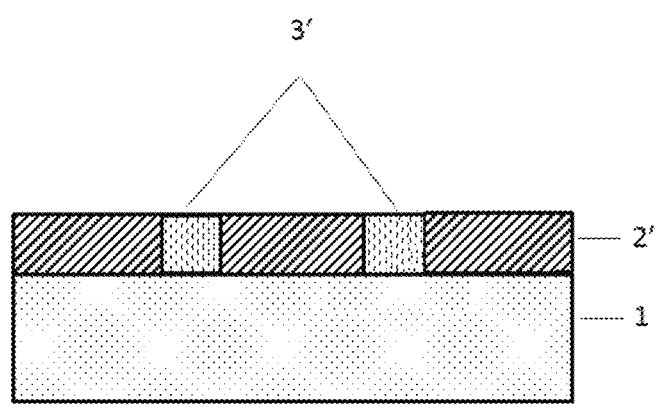

As can be seen from FIG. 6, the structure comprises:

the substrate 1, which is a glass substrate or a plastic substrate;

the negative photoresist layer 2' after developing procedure, which is located on the upper surface of the substrate 1; and the flat liquid crystal display device film 3', which is embedded in the space 5 having the shape defined by the liquid crystal display device film of the negative photoresist layer after developing procedure.

Embodiment 2

FIGS. 3, 4, 7, and 8 show main process steps of a method for manufacturing a flat liquid crystal display device film according to the present embodiment. The liquid crystal device film is made of one selected from a group consisting of metal M1, metal M2, and black matrix (BM). The method mainly comprises following steps.

In step A, as shown in FIG. 3, a negative photoresist layer 2 is coated on a substrate 1, and the negative photoresist layer is exposed with a liquid crystal display device film mask 6 to obtain a negative photoresist layer 2 after exposing procedure which covers the substrate 1.

In step B, the negative photoresist layer 2 after exposing procedure is developed, and a space 5 having a shape defined by a liquid crystal display device film is formed in a negative photoresist layer 2' after developing procedure which covers an upper surface of the substrate. A structure thereof is shown in FIG. 4.

As can be seen from FIG. 4, the structure comprises:

the substrate 1, which is a glass substrate or a plastic substrate; and the negative photoresist layer 2' after developing procedure, which is located on the upper surface of the substrate 1.

In step C, a negative photoresist protection layer 7 is coated on a surface of the negative photoresist layer 2' after developing procedure and a surface of the space 5 having the shape defined by the liquid crystal display device film. According to some embodiments, the negative photoresist protection layer 7 is preferably made of silicon nitride or silicon oxide. According to other embodiments, a thickness of the negative photoresist protection layer 7 is preferably in a range from 0.1 to 0.2 μm.

In step D, the liquid crystal display device film 3 is sputtered and grown on a surface of the negative photoresist layer 2' after developing procedure and a surface of the space 5 having the shape defined by the liquid crystal display device film which are both covered with a negative photoresist protection layer 7, so that the liquid crystal display device film 3 covers the surface of the negative photoresist layer 2' after developing procedure and the surface of the space 5 having the shape defined by the liquid crystal display device film which are both covered with a negative photoresist protection layer 7. That is, the liquid crystal display device film 3 covers a surface of the negative photoresist protection layer 7.

In step E, a positive photoresist layer (a structure thereof is not shown herein) is coated on a surface of the liquid crystal display device film 3, so that the positive photoresist layer covers a surface of the liquid crystal display device film 3, and fills the space 5 having the shape defined by the liquid crystal display film.

Figure 7:
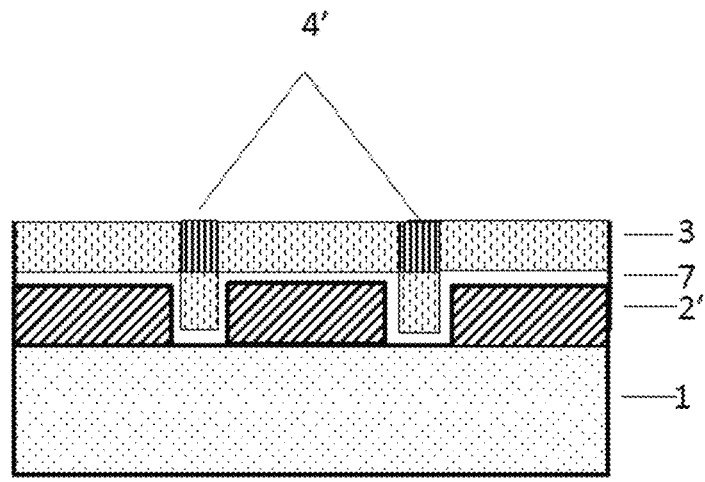

In step F, the positive photoresist layer is exposed with a liquid crystal display device film mask 6 and developed to obtain a positive photoresist layer 4' after developing procedure which is embedded in the space having the shape defined by the liquid crystal display device film of the liquid crystal film, and a structure thereof is shown in FIG. 7.

As can be seen from FIG. 7, the structure comprises:

the substrate 1, which is a glass substrate or a plastic substrate;

the negative photoresist layer 2' after developing procedure, which is located on the upper surface of the substrate 1;

the negative photoresist protection layer 7, which covers the surface of the negative photoresist layer 2' after developing procedure and the surface of the space 5 having the shape defined by the liquid crystal display device film;

the liquid crystal display device film 3, which covers the surface of the negative photoresist protection layer 7; and the positive photoresist layer 4' after developing procedure, which is embedded in the space having the shape defined by the liquid crystal display device film of the liquid crystal display device film.

In step G, excess liquid crystal display device film is etched with a photoresist pattern mask to obtain a flat liquid crystal display device film 3'. The flat liquid crystal display device film 3' is embedded in the space 5 having the shape defined by the liquid crystal display device film of the negative photoresist layer 2' after developing procedure and is flush with the negative photoresist layer 2' after developing procedure. A structure thereof is shown in FIG. 8.

Figure 8:
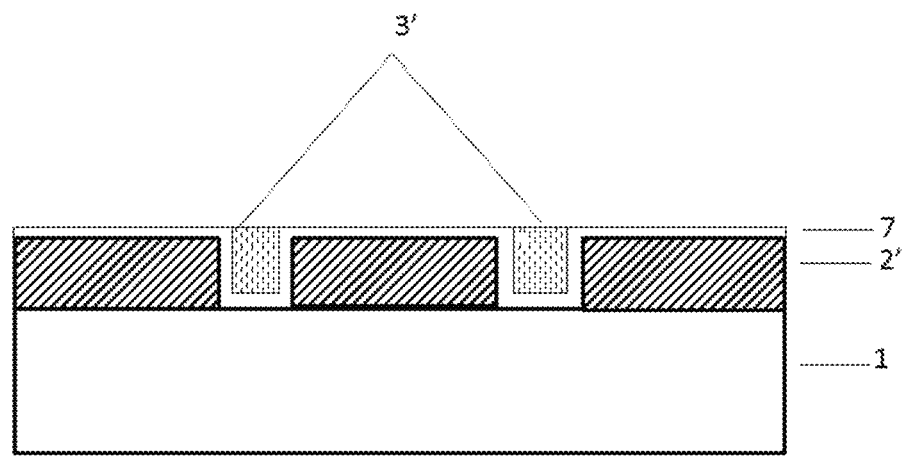

As can be seen from FIG. 8, the structure comprises:

the substrate 1, which is a glass substrate or a plastic substrate;

the negative photoresist layer 2' after developing procedure, which is located on an upper surface of the substrate 1;

the negative photoresist protection layer 7, which covers the surface of the negative photoresist layer 2' after developing procedure and the surface of the space 5 having the shape defined by the liquid crystal display device film; and the flat liquid crystal display device film 3', which is embedded in the space 5 having the shape defined by the liquid crystal display device film of the negative photoresist layer after developing procedure which is covered with the negative photoresist protection layer 7.

According to the embodiment of the method for manufacturing the flat liquid crystal display device film as shown in FIGS. 3 to 6, during the manufacturing process, the negative photoresist protection layer is not formed on the surface of the negative photoresist layer. Therefore, when the negative photoresist layer after exposing procedure is developed, a developer used therein should be selected carefully to prevent the negative photoresist layer from being damaged.

According to the embodiment of the method for manufacturing the flat liquid crystal display device film as shown in FIGS. 3, 4, 7, and 8, during the manufacturing process, the negative photoresist protection layer is formed on the surface of the negative photoresist layer. Therefore, when the negative photoresist layer after exposing procedure is developed, the developer used therein can be selected from a wide range.

In conclusion, according to the method for manufacturing the flat liquid crystal display device film, influence of a wiring thickness on topography of array film can be reduced. Without affecting a qualified rate of a product, a low-resistance wiring can be realized, and thus an RC delay during signal transmission of a large-sized panel can be reduced. Meanwhile, when the method is applied, a metal layer with a larger thickness relative to that of a metal layer made by a conventional method can be made. Therefore, wiring load of a large-sized panel can be reduced, resistance of signal line can be reduced, RC delay can be decreased, and display quality can be improved.

The above embodiments are described only for better understanding, rather than restricting, the present disclosure. Any person skilled in the art can make amendments to the implementing forms or details without departing from the spirit and scope of the present disclosure. The protection scope of the present disclosure shall be determined by the scope as defined in the claims.

LIST OF REFERENCE SIGNS

1—Substrate;
2—Negative photoresist layer;
2'—Negative photoresist after developing procedure;
3—Liquid crystal display device film;
3'—Flat liquid crystal display device film;
4—Positive photoresist layer;
4'—Positive photoresist layer after developing procedure;
5—Space having a shape defined by a liquid crystal display device film;
6—Liquid crystal display device film mask; and
7—Negative photoresist protection layer.

The invention claimed is:

1. A method for manufacturing a flat liquid crystal display device film, comprising steps of:

step A, coating a negative photoresist layer on a substrate, and exposing the negative photoresist layer with a liquid crystal display device film mask to obtain a negative photoresist layer after exposing procedure which covers the substrate;

step B, developing the negative photoresist layer after exposing procedure, and forming a space having a shape defined by a liquid crystal display device film in the negative photoresist layer after developing procedure which covers an upper surface of the substrate;

step C, coating a negative photoresist protection layer on the surface of the negative photoresist layer after developing procedure and the surface of the space having the shape defined by the liquid crystal display device film;

step D, sputtering and growing a liquid crystal display device film on a surface of the negative photoresist layer after developing procedure and a surface of the space having the shape defined by the liquid crystal display device film, so that the liquid crystal display device film covers the surface of the negative photoresist layer after developing procedure, and meanwhile covers the surface of the space having the shape defined by the liquid crystal display device film;

step E, coating a positive photoresist layer on a surface of the liquid crystal display device film, so that the positive photoresist layer covers the surface of the liquid crystal display device film, and fills the space having the shape defined by the liquid crystal display device film;

step F, exposing the positive photoresist layer with a liquid crystal display device film mask, and developing the positive photoresist layer, to obtain a positive photoresist layer after developing procedure which is embedded in the space having the shape defined by the liquid crystal display device film of the liquid crystal display device film; and step G, etching excess liquid crystal display device film with a photoresist pattern mask to obtain the flat liquid crystal display device film.

2. The method according to claim 1, wherein in step G, the flat liquid crystal display device film is embedded in the space having the shape defined by the liquid crystal display device film of the negative photoresist layer after developing procedure and is flush with the negative photoresist layer after developing procedure.

3. The method according to claim 1, wherein in step A, a thickness of the negative photoresist layer coated therein is from 1.0 to 1.5 times a thickness of the liquid crystal display device film.

4. The method according to claim 1, wherein in step D, the liquid crystal display device film is sputtered and grown on a surface of the negative photoresist layer after developing procedure and a surface of the space having the shape defined by the liquid crystal display device film which are both covered with a negative photoresist protection layer, so that the liquid crystal display device film covers the surface of the negative photoresist layer after developing procedure and the surface of the space having the shape defined by the liquid crystal display device film which are both covered with the negative photoresist protection layer.

5. The method according to claim 1, wherein a thickness of the negative photoresist protection layer is in a range from 0.1 to 0.2 µm.

6. The method according to claim 1, wherein the negative photoresist protection layer is made of silicon nitride or silicon oxide.

7. The method according to claim 1, wherein the flat liquid crystal display device film is made of one selected from a group consisting of metal M1, metal M2 and black matrix (BM).

8. The method according to claim 1, wherein the substrate is a glass substrate or a plastic substrate.

* * * * *